US011021787B2

(12) United States Patent
Deus

(10) Patent No.: US 11,021,787 B2
(45) Date of Patent: Jun. 1, 2021

(54) COATING ARRANGEMENT AND METHOD

(71) Applicant: VON ARDENNE Asset GmbH & Co. KG, Dresden (DE)

(72) Inventor: Carsten Deus, Dresden (DE)

(73) Assignee: VON ARDENNE ASSET GMBH & CO. KG, Dresden (DE)

(*) Notice: Subject to any disclaimer, the term of this patent is extended or adjusted under 35 U.S.C. 154(b) by 0 days.

(21) Appl. No.: 16/509,512

(22) Filed: Jul. 12, 2019

(65) Prior Publication Data
US 2020/0017953 A1    Jan. 16, 2020

(30) Foreign Application Priority Data
Jul. 16, 2018   (DE) .................... 10 2018 117 130.7

(51) Int. Cl.
| C23C 14/30 | (2006.01) |
| H01J 37/305 | (2006.01) |
| H01J 37/20 | (2006.01) |
| C23C 14/50 | (2006.01) |
| H01J 37/06 | (2006.01) |

(52) U.S. Cl.
CPC .............. C23C 14/30 (2013.01); C23C 14/50 (2013.01); H01J 37/06 (2013.01); H01J 37/20 (2013.01); H01J 37/305 (2013.01); *H01J 2237/204* (2013.01); *H01J 2237/3132* (2013.01); *H01J 2237/31732* (2013.01)

(58) Field of Classification Search
CPC .................................................. C23C 14/30
See application file for complete search history.

(56) References Cited

U.S. PATENT DOCUMENTS

| 3,909,663 | A | * | 9/1975 | Thomas | H01J 37/241 315/106 |
| 3,931,490 | A | * | 1/1976 | Grothe | C23C 14/30 219/121.15 |
| 6,319,569 | B1 | * | 11/2001 | Callaway | C23C 14/541 118/723 EB |
| 6,589,351 | B1 | * | 7/2003 | Bruce | C23C 14/246 118/723 EB |
| 2002/0074516 | A1 | * | 6/2002 | Novak | H01L 21/68 250/491.1 |

(Continued)

FOREIGN PATENT DOCUMENTS

| DE | 10 2013 107 454 A1 | 1/2015 |
| DE | 10 2015 107 430 A1 | 11/2016 |
| DE | 10 2016 122 671 A1 | 5/2018 |

OTHER PUBLICATIONS

German Search Report based on Application No. 10 2018 117 130.7 (8 pages) dated Aug. 22, 2018 (for reference purpose only).

*Primary Examiner* — Keath T Chen
(74) *Attorney, Agent, or Firm* — Viering, Jentschura & Partner MbB

(57) ABSTRACT

In accordance with various embodiments, a coating arrangement may comprise: an electron beam gun for providing an electron beam; a beam trap for trapping the electron beam; a control device for driving the electron beam gun and/or the beam trap, wherein the control device is configured to switch over the driving between a plurality of configurations, of which: in a first configuration, the electron beam is directed onto the beam trap; and in a second configuration, the electron beam is directed past the beam trap.

14 Claims, 8 Drawing Sheets

(56) References Cited

U.S. PATENT DOCUMENTS

2002/0110698 A1* 8/2002 Singh .................. C23C 30/00
428/472
2006/0222922 A1* 10/2006 Murphy .............. H01M 8/1246
429/495

* cited by examiner

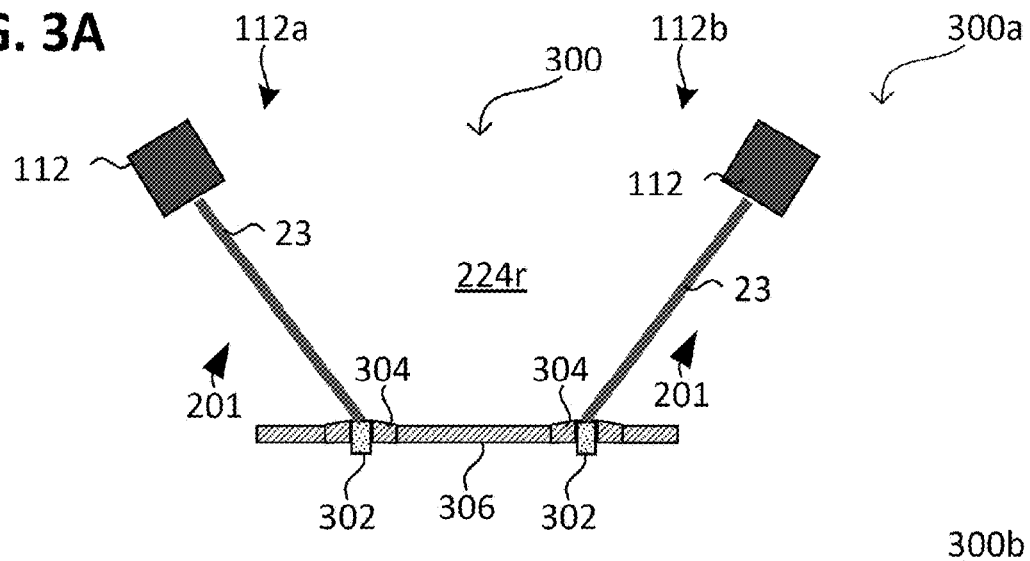
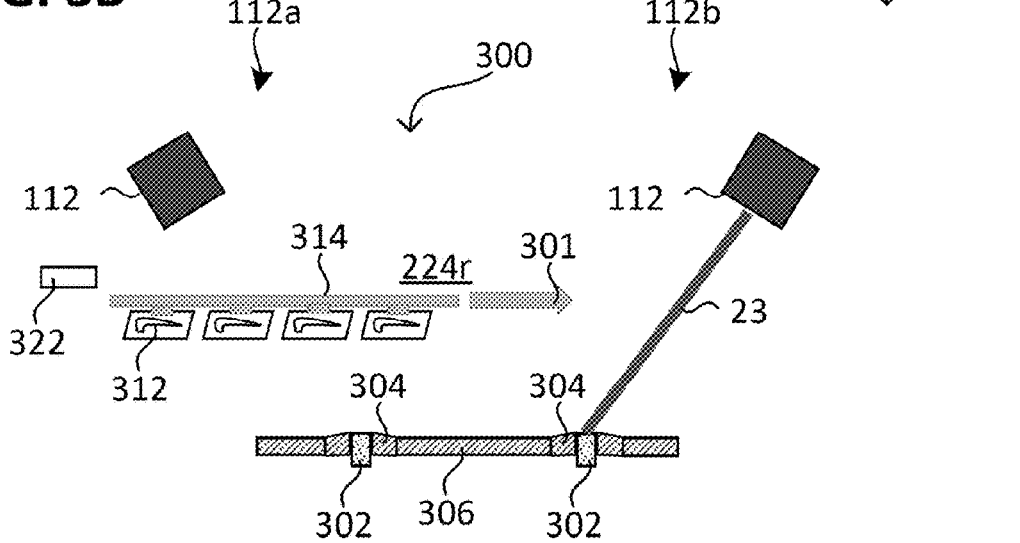
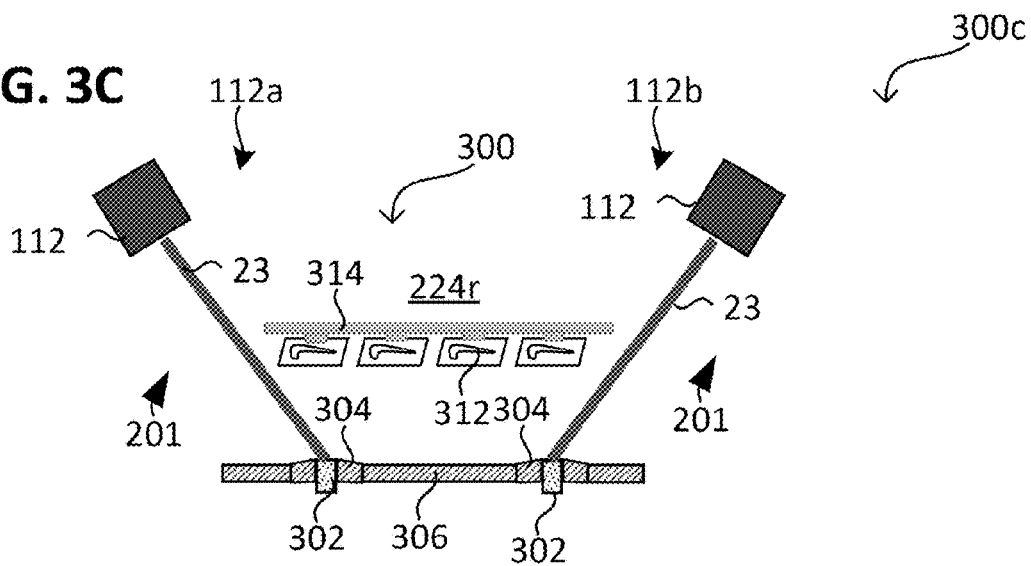

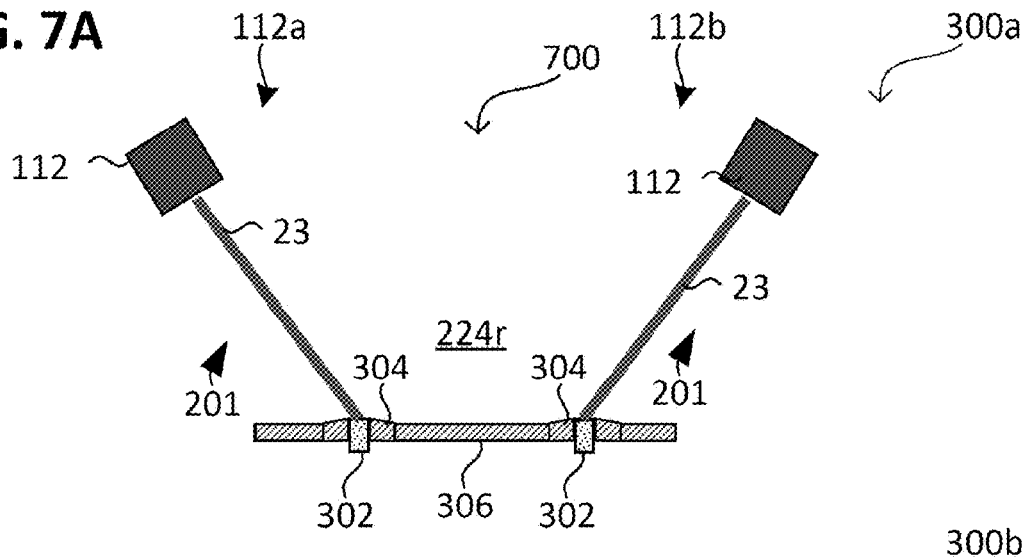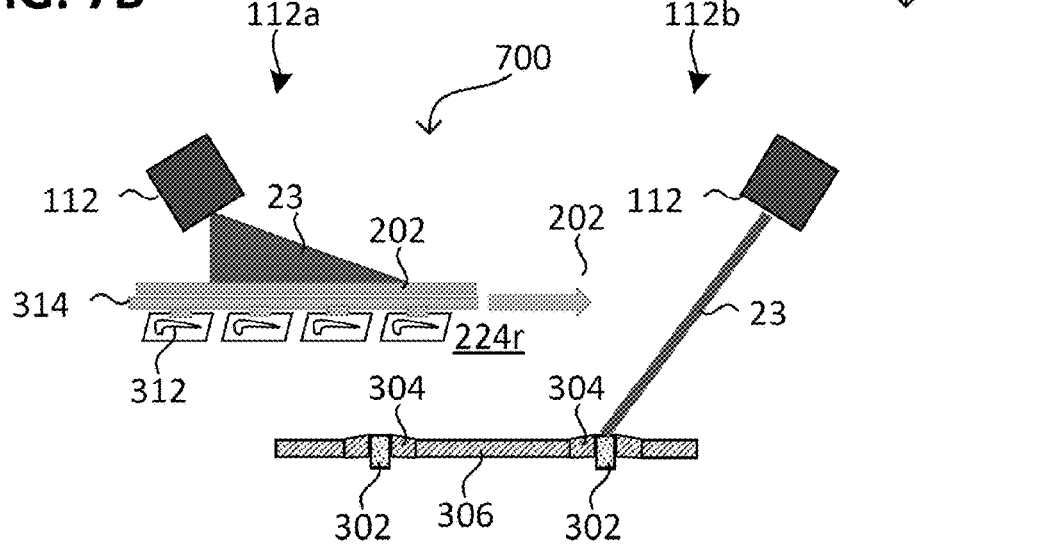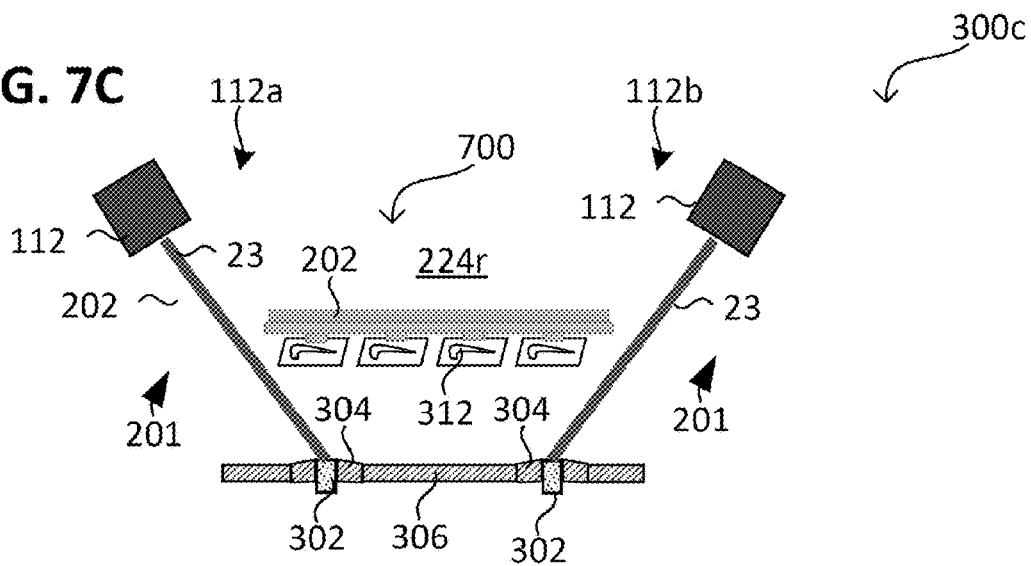

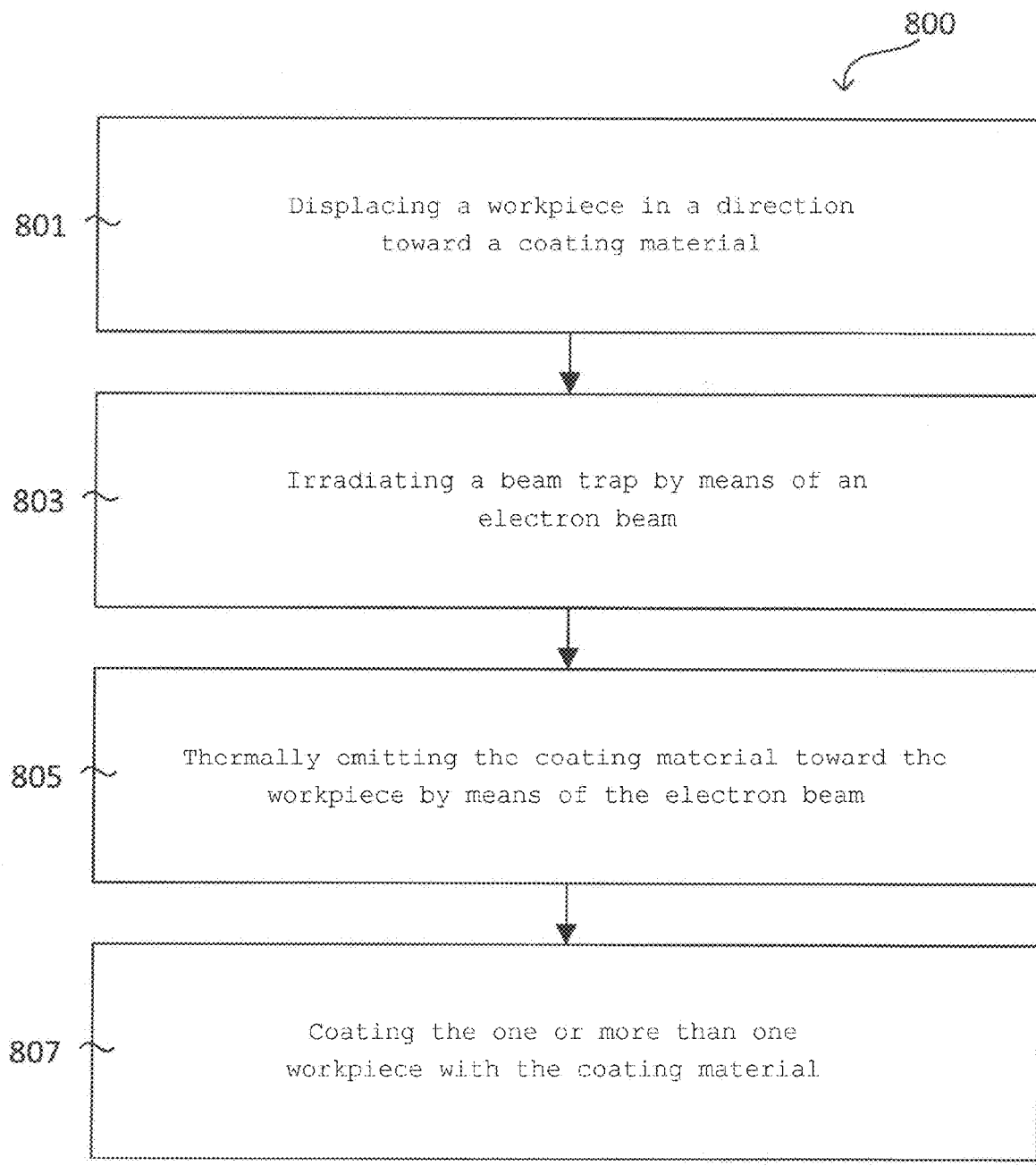

COATING ARRANGEMENT AND METHOD

CROSS-CITING TO RELATED APPLICATIONS

The present application claims priority to German Application 10 2018 117 130.7, which was filed on Jul. 16, 2018, which is fully incorporated herein by reference.

TECHNICAL FIELD

The disclosure relates to a coating arrangement and to a method.

BACKGROUND

In general, a substrate, for example a glass substrate, a metal substrate and/or a polymer substrate, may be treated (processed), e.g. coated, such that the chemical and/or physical properties of the substrate may be altered. For the purpose of coating a substrate, various physical coating methods may be carried out, which also include electron beam physical vapor deposition (EB-PVD), inter alia. By way of example, a vacuum coating installation may be used to deposit one layer or a plurality of layers on one substrate or on a plurality of substrates by means of chemical and/or physical vapor deposition.

By means of electron beam physical vapor deposition (EB-PVD), a so-called vapor source (illustratively a locally highly heated region) may be produced. Evaporated material propagates proceeding from the vapor source and may condense on a workpiece, thereby forming a layer on the workpiece.

Electron beam physical vapor deposition (EB-PVD) may be carried out in various modifications. Usually, the material to be evaporated (referred to as target material or evaporation material) is melted by means of the electron beam and is therefore provided in a crucible. The workpiece to be coated may be guided for example above the crucible, e.g. in a freely suspended manner or in a manner lying in a workpiece carrier, and may be coated illustratively from the bottom.

Usually, for the purpose of coating large workpieces, such as turbine components, for instance, with ceramic thermal insulation layers, recourse is had to EB-PVD. In industrial coating installations with high productivity, the vapor deposition is carried out for example from a plurality of crucibles, e.g. at least (i.e. not less than) two crucibles. The workpieces to be coated are mounted on substrate carriers and transported through a plurality of process chambers in accordance with a process sequence. In order to achieve an optimum morphology of the vapor-deposited layer, it may be necessary to heat the workpieces prior to coating, e.g. to approximately 1000° C. or more, and/or to keep them at this temperature at least during coating. In this case, keeping at the temperature during coating is supported by the waste heat of the vapor deposition process.

If the coating installation is intended to be configured for a high productivity (e.g. throughput), it is conventional practice to chose a geometry in which the electron beam is directed onto the evaporation material from above. When the substrate carrier is transported into the coating chamber, a temporary blocking of the electron beam path between one of the two electron sources and the assigned evaporation crucible by the workpieces to be coated may occur as a result. In order to prevent the workpieces to be coated from being damaged by the electron beam, the blocked electron source is switched off during the entrance of the workpieces for the blocking time—typically a few seconds.

SUMMARY

In accordance with various embodiments, it has been recognized that on account of the shutdown of the electron beam source—and thus of the corresponding vapor deposition process—conventionally it is necessary to accept interruption of the overall energy input into the coating chamber. This may entail a temperature decrease in the coating chamber, e.g. below the coating temperature required for optimum layer growth (e.g. of approximately 1000° C.). By way of example, the electron beam shutdown process may result in a temperature decrease to 900° C. or less, as a result of which the manifestation of the structure/morphology in particular of the seed layer may be disadvantageously influenced. This may in turn impair the adhesion of the coating, in particular after thermocyclic loading.

If the temperature decrease is intended to be reduced, it may be necessary to carry out the shutdown of the electron beam source selectively, i.e. for one of the other electron beam sources to continue to be operated at the same time. In this operating configuration, it may be necessary to configure the high-voltage supply for the electron beam sources in such a way that independent operation of the electron beam source is made possible. By way of example, the high-voltage supply may be configured to enable a plurality of electron beam sources to be switched on and off independently of one another. This configuration of the high-voltage supply is associated with higher costs than a so-called dual high-voltage supply, which supplies both electron beam sources synchronously. The dual high-voltage supply may for example not allow a plurality of electron beam sources to be operated independently of one another, but rather only joint operation with all of these supplied electron beam sources being switched on and off simultaneously.

In accordance with various embodiments, a coating arrangement and a method are provided by which the coating of one or more than one workpiece is simplified, improved and/or provided with higher quality.

In accordance with various embodiments, a coating arrangement may include: an electron beam gun for providing an electron beam; a beam trap for trapping the electron beam; a control device for driving the electron beam gun and/or the beam trap, wherein the control device is configured to switch over the driving between a plurality of configurations, of which: in a first configuration, the electron beam is directed onto the beam trap; and in a second configuration, the electron beam is directed past the beam trap.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiment. In the following description, various embodiments are described with reference to the following drawings, in which:

FIGS. 3A to 3C each show a coating arrangement and/or a method in a plurality of configurations in accordance with various embodiments in a schematic side view or cross-sectional view;

FIGS. 7A to 7C each show a coating arrangement and/or a method in a plurality of configurations in accordance with various embodiments in a schematic side view or cross-sectional view; and FIG. 8 shows a method in accordance with various embodiments in a schematic flow diagram.

DETAILED DESCRIPTION

Figure 1:
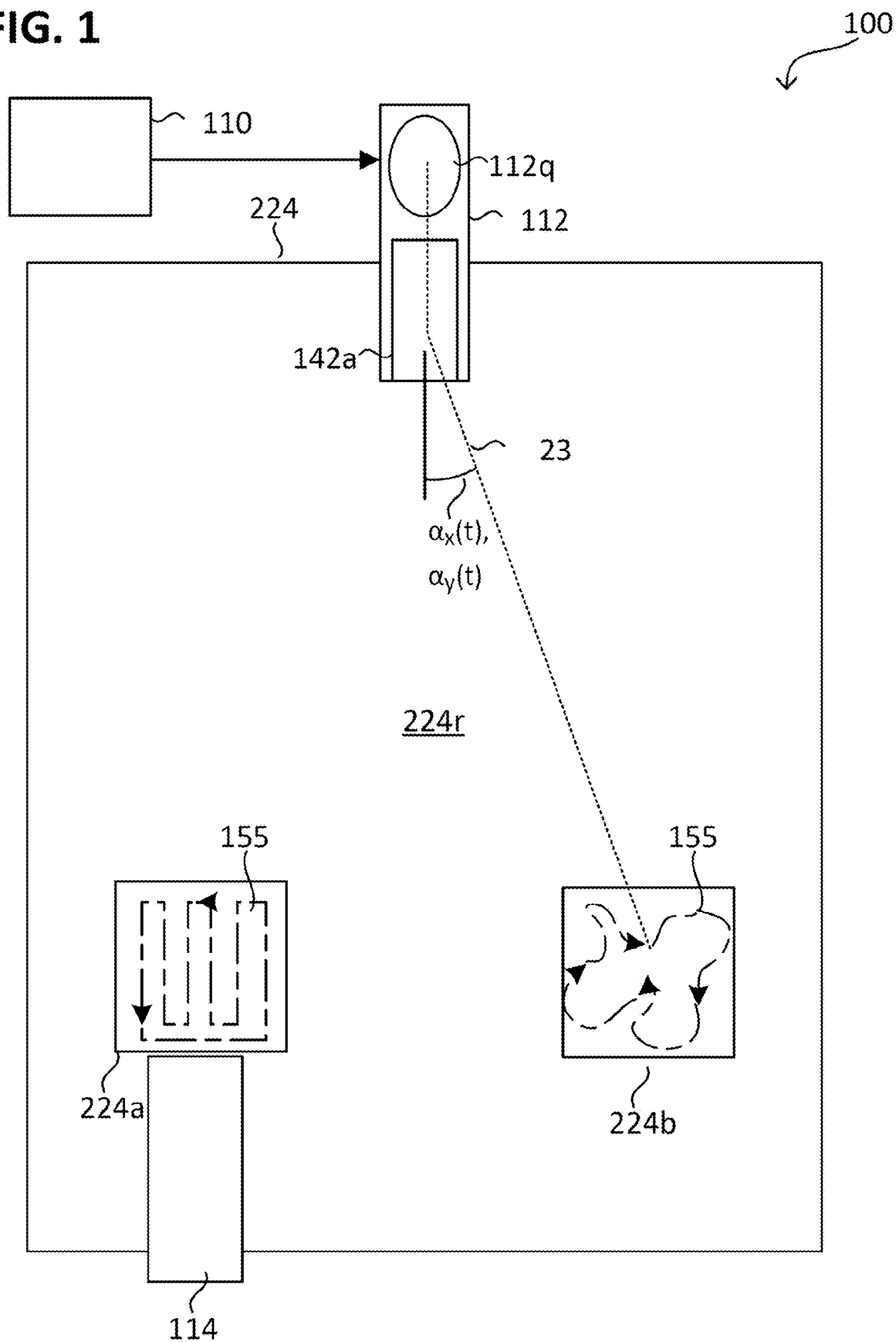
FIG. 1 shows a coating arrangement in accordance with various embodiments in a schematic side view or cross-sectional view.

In the following detailed description, reference is made to the accompanying drawings, which form part of this description and show for illustration purposes specific embodiments in which the disclosure may be implemented. In this regard, direction terminology such as, for instance, "at the top", "at the bottom", "at the front", "at the back", "front", "rear", etc. is used with respect to the orientation of the figure(s) described. Since components of embodiments may be positioned in a number of different orientations, the direction terminology serves for illustration and is not restrictive in any way whatsoever. It goes without saying that other embodiments may be used and structural or logical changes may be made, without departing from the scope of protection of the present disclosure. It goes without saying that the features of the various exemplary embodiments described herein may be combined with one another, unless specifically indicated otherwise. Therefore, the following detailed description should not be interpreted in a restrictive sense, and the scope of protection of the present disclosure is defined by the appended claims.

In the context of this description, the terms "connected", "attached" and "coupled" are used to describe both a direct and an indirect connection (e.g. resistive and/or electrically conductive, e.g. an electrically conductive connection), a direct or indirect attachment and a direct or indirect coupling. In the figures, identical or similar elements are provided with identical reference signs, insofar as this is expedient.

In accordance with various embodiments, the term "coupled" or "coupling" may be understood in the sense of (e.g. mechanical, hydrostatic, thermal and/or electrical), e.g. direct or indirect, connection and/or interaction. A plurality of elements may be coupled to one another for example along an interaction chain along which the interaction (e.g. a signal) may be transmitted. By way of example, two elements coupled to one another may exchange an interaction with one another, e.g. a mechanical, hydrostatic, thermal and/or electrical interaction. In accordance with various embodiments, "coupled" may be understood in the sense of a mechanical (e.g. physical or material) coupling, e.g. by means of a direct physical contact. A coupling may be configured to transmit a mechanical interaction (e.g. force, torque, etc.).

Open-loop control may be understood as intentionally influencing a system. In this case, the state of the system may be changed in accordance with a predefinition. Closed-loop control may be understood as open-loop control with a state change of the system as a result of disturbances additionally being counteracted. Illustratively, the open-loop control may have a feedforward controlled system and thus illustratively implement a sequence control that converts an input variable into an output variable. However, the controlled system may also be part of a closed-loop control circuit, such that a closed-loop control is implemented. In contrast to pure feedforward control, the closed-loop control exhibits a continuous influencing of the input variable by the output variable, which is brought about by the closed-loop control circuit (feedback). In other words, a closed-loop control may be used as an alternative or in addition to the open-loop control, or closed-loop control may be carried out as an alternative or in addition to open-loop control. In the case of a closed-loop control, an actual value of the controlled variable (e.g. determined on the basis of a measurement value) is compared with a reference value (a setpoint value or a predefinition or a predefined value) and, accordingly, the controlled variable may be influenced by means of a manipulated variable (using an actuator) in such a way as to result as far as possible in a small deviation of the respective actual value of the controlled variable from the reference value.

In accordance with various embodiments, a device and/or a method may be provided for avoiding the temperature decrease in the process space during the entrance of the workpieces to be coated. Alternatively or additionally, a device and/or a method may be provided which make it possible to use a more cost-effective multiple high-voltage supply for a plurality of electron beam sources (e.g. two electron beam sources) of a coating arrangement. By way of example, the coating arrangement including exactly two electron beam sources may also be referred to as a dual source vapor deposition installation and the corresponding multiple high-voltage supply may then be referred to as a dual high-voltage supply.

In accordance with various embodiments, a beam trap (e.g. a beam diffusor) may be provided in the process space. The beam trap may be provided for example in the form of a high-temperature-resistant assembly (also referred to as beam trap assembly, e.g. diffusor assembly). The beam trap may be configured, during the entrance of the workpieces to be coated into the vacuum chamber in which the coating of the workpieces is carried out (also referred to as coating chamber), to be exposed to the electron beam of the electron beam source blocked by the entering workpieces (i.e. to be irradiated with the electron beam).

The energy radiated into the beam trap may be radiated back into the process chamber for example diffusely, e.g. at least partly immediately (by means of backscattered electrons) and/or at least partly with a short time delay, e.g. as a result of an increase in temperature of the beam trap and subsequent emission in the form of thermal radiation. The exposure of the beam trap (e.g. diffusor) instead of the evaporation crucible eliminates the need to shut down the electron beam. The energy radiated back into the vacuum chamber diffusely may lead and/or at least contribute to a temporal homogenization of the power balance of the coating process space and thus to a temporal stabilization of the process temperature.

In accordance with various embodiments, a coating arrangement may be provided including two or more crucibles and a dual high-voltage supply. The dual high-voltage supply includes, for example, a high-voltage supply for two electron sources, wherein both electron sources are supplied with acceleration voltage by the same high-voltage transformer.

In accordance with various embodiments, a method may be provided for coating workpieces (e.g. components) by means of EB-PVD in a vacuum chamber (e.g. a coating chamber, also referred to as vapor deposition chamber) with an electron beam source, a crucible and a handling device (more generally a transport device) for workpieces. The method may include: exposing installed chamber equipment and/or the crucible to the electron beam with a conditioning deflection pattern (an electron beam deflection pattern) for producing an increased temperature level of installed chamber equipment and shields, switching over the electron beam deflection sequence to a blanking deflection pattern that causes no damage to the components to be coated during the following transport step, transporting the parts to be coated into the vapor deposition chamber by means of the transport device (e.g. the handling device), and switching over the electron beam deflection sequence to a third working deflection pattern configured for evaporating vapor deposition material from the crucible and for maintaining an increased temperature level of installed chamber equipment and shields.

A coating arrangement for the vapor deposition (in other words coating from vapor) of one or more than one workpiece (or other components) by means of EB-PVD may include: a vapor deposition chamber (e.g. vacuum chamber), a crucible, a handling device for transporting the one or more than one workpiece to be coated, the latter blocking the beam path from the electron source to the crucible during the handling process, and a high-temperature-resistance beam trap (e.g. electron diffusor) configured in such a way that it may take up the power of the electron beam at least during the handling process. The beam trap may be arranged for example closer to the electron source than to the transport plane of the one or more than one workpiece to be coated. The beam trap may be mounted for example movably, e.g. pivotably and/or displaceably. The beam trap may include a high-temperature-resistant material for example at least at a surface facing the electron beam. The beam trap may be at least partly water-cooled. The beam trap may include for example at least one water-cooled surface facing the electron beam. The beam trap may include, at least at a surface facing the electron beam, an electron reflector consisting of a high-temperature-resistant material (e.g. a material having a melting point of greater than 1200° C., preferably greater than 1500° C.). The beam trap may be arranged for example in such a way that, during the handling process and/or after the handling process, said beam trap is in thermal radiation interaction with the components to be coated. The beam trap may be arranged for example in such a way that when the beam trap is exposed to the electron beam, at least some of the electrons are reflected in the direction of the workpieces to be coated during the handling process or after the handling process.

The coating arrangement may optionally include: a second electron source and a second crucible, wherein the first and second electron sources are supplied with acceleration voltage by means of a common high-voltage transformer.

In accordance with various embodiments, a method for coating one or more than one workpiece (or other components) by means of EB-PVD in a vapor deposition chamber with an electron source, a crucible and a handling device for workpieces may be provided, the method including: (e.g. in a conditioning configuration) exposing installed chamber equipment and/or the crucible to the electron beam with a conditioning deflection pattern for the purpose of producing an increased temperature level of installed chamber equipment and shields; switching over the electron beam deflection sequence to a blanking deflection pattern that causes no damage to the workpieces (e.g. components) to be coated during the following transport step; transporting the workpieces to be coated into the vapor deposition chamber by means of the handling device; switching over the electron beam deflection sequence to a working deflection pattern suitable for evaporating vapor deposition material from the crucible and for maintaining an increased temperature level of installed chamber equipment and shields. Alternatively or additionally, a method may include: positioning the beam trap (e.g. diffusor) in a rest position; exposing installed chamber equipment and/or the crucible to the electron beam with the conditioning deflection pattern for the purpose of producing an increased temperature level of installed chamber equipment and shields; positioning the diffusor in a working position; switching over the electron beam deflection sequence to a scanning deflection pattern that causes no damage to the components to be coated during the following transport step, and wherein significant portions of the electron beam power are directed onto the beam trap; transporting the workpieces to be coated into the vapor deposition chamber by means of the handling device; positioning the beam trap in a rest position; switching over the electron beam deflection sequence to a working deflection pattern suitable for evaporating vapor deposition material from the crucible and for maintaining an increased temperature level of installed chamber equipment and shields. The conditioning deflection pattern and the blanking deflection pattern may optionally be identical. The electron beam power may be varied (e.g. controlled by open-loop and/or closed-loop control) during the deflection in accordance with the conditioning deflection pattern, the blanking deflection pattern and/or during transport in such a way that the temporal variance of the temperature of the components to be coated during the vapor deposition is minimized, in particular less than +/−25K, preferably less than +−10K.

FIG. 1 illustrates a coating arrangement 100 in accordance with various embodiments in a schematic side view or cross-sectional view.

In accordance with various embodiments, a coating arrangement 100 may include the following: a vacuum chamber 224 (also referred to as vacuum process chamber or vapor deposition chamber), in which a coating space 224r is arranged, wherein the coating space 224r may for example fill the interior of the vacuum chamber 224 and/or have at least one vacuum.

The vacuum chamber 224 may include one or more than one vacuum pump (e.g. forevacuum pump and/or high vacuum pump) for providing a vacuum in the interior of the vacuum chamber 224 and/or in the coating space 224r.

The coating space 224r may include at least one (i.e. exactly one or more than one) impingement region 224a, 224b.

The coating arrangement 100 may furthermore include at least one (i.e. exactly one or more than one) electron beam gun 112 including, for example, an electron beam source 112q and a deflection system 142a for deflecting an electron beam 23 into the plurality of impingement regions 224a, 224b. The electron beam source 112q may include an electron source (e.g. a cathode, e.g. hot cathode) and a beam shaping unit (e.g. an anode).

The electron beam 23 may be deflected for example in accordance with one (e.g. the same) deflection sequence (also referred to as electron beam deflection sequence), e.g. repeatedly successively in accordance with the same deflection sequence. A deflection sequence may illustratively represent a succession of setpoint impingement points and/or a setpoint trajectory (also referred to as setpoint deflection trajectory) onto which the electron beam 23 is directed (i.e. which is intended to be traversed by means of the electron beam 23). The or each deflection sequence may include and/or define at least one (i.e. exactly one or more than one) deflection figure. The or each deflection figure may define a self-contained trajectory 155 or a succession of setpoint impingement points 155 along the self-contained trajectory 155 which is intended to be irradiated (the so-called impingement FIG. 155). The impingement FIG. 155 may represent for example a trajectory T(P,t) of the impingement location P(x,y,z) of the electron beam 23. The size and orientation of the impingement FIG. 155 may be dependent on its position in space and optionally be changed and/or transformed in a time-dependent manner.

More generally, the impingement FIG. 155 is described by the deflection figure (also referred to as deflection pattern), which may be related for example to the deflection angle ($\alpha_x(t)$, $\alpha_y(t)$) by which the electron beam 23 is deflected from its rest position. The or each deflection figure may be assigned to an impingement region 224a, 224b, for example. By way of example, the corresponding impingement figure may be arranged in an impingement region 224a, 224b. To put it more generally, the deflection figure may image the electron beam 23 onto the impingement FIG. 155 (analogously to a central projection). The or each deflection sequence may include or be formed from exactly one or more than one deflection figure.

Optionally, the coating arrangement 100 may include at least one target holder 114 (i.e. exactly one or more than one target holder) for holding the target material (also referred to as evaporation material or coating material) in one or more than one impingement region of the coating arrangement 100. Alternatively or additionally, a target material that is intended to be evaporated by means of the electron beam 23 may be arranged in the or each impingement region 224a, 224b. Evaporation may generally be understood as conversion into the gas phase and may also include sublimation. Alternatively or additionally, a beam trap may be arranged in at least one impingement region 224a, 224b, as will be described in even greater detail later.

The or each target holder 114 may include a crucible, for example. A crucible may be understood as a temperature-resistant (e.g. 1000° C. or more) container configured for receiving the target material. For this purpose, the crucible may include a cavity, for example, in which the target material may be arranged. The cavity may be open in the direction of the electron beam gun 112 carrying out irradiation or configured for irradiation, such that the electron beam 23 may be directed onto the target material.

The workpiece to be coated may be arranged and/or transported in the coating space 224r, as will be described in even greater detail later.

The target material, i.e. the material to be evaporated (evaporation material), may include e.g. a metal (e.g. an alloy), an organic material, a plastic, graphite or a ceramic. The distance between the electron beam source 112q and the evaporation material may be for example in a range of approximately 0.1 m to approximately 5 m, e.g. in a range of approximately 0.1 m to approximately 0.5 m. Alternatively or additionally, the target material may be arranged in a vacuum, e.g. while it is irradiated and/or evaporated.

Optionally, the energy supply 110 may include a transformer that provides the supply variable, e.g. the acceleration voltage, for a plurality of electron beam guns 112.

The one or more than one electron beam gun 112 may be electrically supplied by means of an energy supply 110. By way of example, the energy supply 110 may provide an electrical variable (also referred to as supply variable) that defines the total power of the electron beam 23. The supply variable may be for example an acceleration voltage and/or a cathode current of the electron beam gun 112. The supply variable, e.g. the acceleration voltage, may be provided by means of a transformer of the energy supply 110.

By way of example, the total power of the electron beam 23 may be controlled by open-loop and/or closed-loop control by means of the electrical variable being changed. Alternatively or additionally, the electron source may be configured in such a way that the distance between cathode and anode of the electron source may be changed. The total power of the electron beam 23 may then be controlled by open-loop and/or closed-loop control by changing the distance between cathode and anode.

Figure 2A:
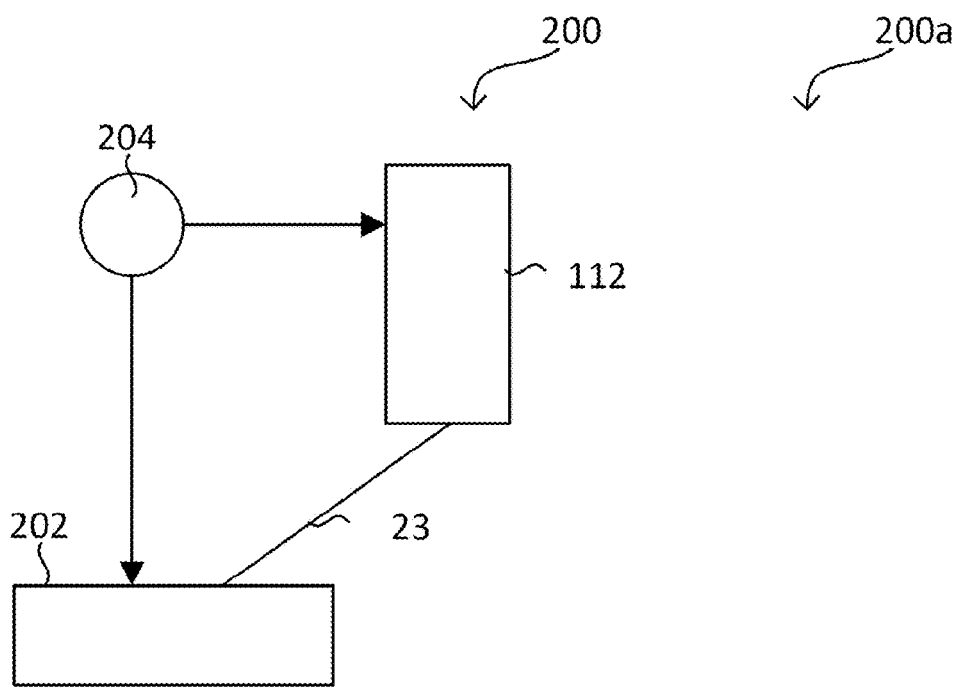
FIGS. 2A and 2B each show a coating arrangement and/or a method in a plurality of configurations in accordance with various embodiments in a schematic side view or cross-sectional view.
Figure 2B:
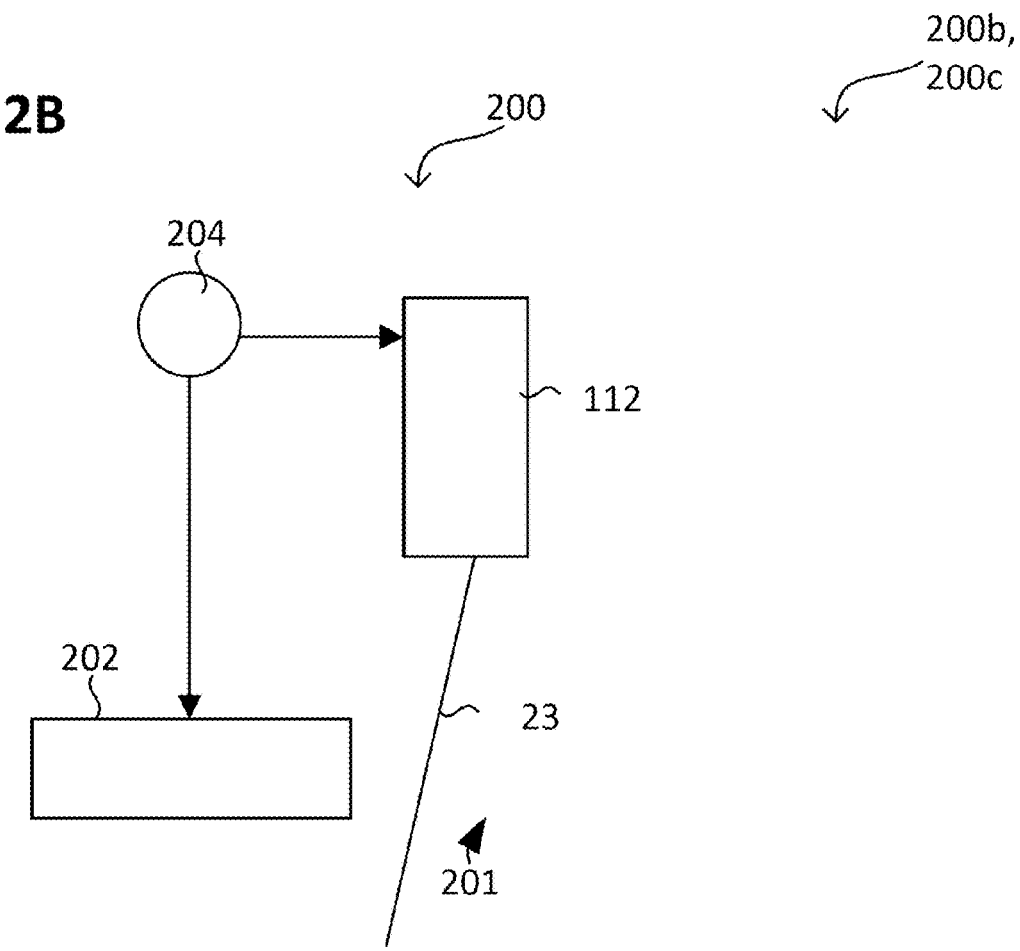

FIG. 2A and FIG. 2B each illustrate a coating arrangement 200 and/or a method in a plurality of configurations 200a, 200b in accordance with various embodiments in a schematic side view or cross-sectional view, e.g. the coating arrangement 100.

The electron beam gun 112 may be configured for providing (e.g. generating and/or emitting) the electron beam 23. One or more than one beam trap 202, e.g. one or more than one planar beam trap 202, may be arranged next to the electron beam gun 112. The electron beam gun 112 and/or the or each beam trap 202 may be driven by means of a control device 204 in accordance with a plurality of configurations 200a, 200b.

Driving may be understood to mean that the operating point of the electron beam gun 112 and/or of the beam trap 202 is controlled by open-loop and/or closed-loop control by means of the control device 204. By way of example, the control device 204 may be configured to feed drive energy and/or a mechanical force to the beam trap 202 (e.g. in a manner controlled by closed-loop and/or open-loop control) (e.g. by means of an actuator). Alternatively or additionally, the control device 204 may be configured to provide the electron beam gun 112 (e.g. in a manner controlled by closed-loop and/or open-loop control) with a plurality of deflection patterns in accordance with which the electron beam 23 is deflected. Alternatively or additionally, the control device 204 may be configured to supply the electron beam gun 112 with electrical power (e.g. in a manner controlled by closed-loop and/or open-loop control).

The plurality of configurations 200a, 200b may include at least one first configuration(s) 200a and one second configuration(s) 200b and optionally one or more than one third configuration(s) 200c, as will be described in even greater detail later.

In the first configuration 200a (also referred to as blanking configuration 200a), the electron beam 23 may be directed onto the beam trap 202. By way of example, in the first configuration 200a, the beam trap 202 may be irradiated by means of the electron beam 23, e.g. in accordance with a first deflection pattern (also referred to as blanking deflection pattern) and/or a first deflection sequence (also referred to as blanking sequence).

Irradiating a body (e.g. the beam trap 202 and/or the coating material) may include introducing energy into the latter, e.g. heating the latter by means of the energy. Alternatively or additionally, the energy introduced into the body may be re-emitted again, e.g. by means of thermal radiation and/or electron radiation (e.g. secondary electrons).

In contrast to the coating material, however, the beam trap 202 cannot take up phase transition heat (e.g. sublimation heat, evaporation heat and/or vaporization heat). Alternatively or additionally, the thermal power loss of the beam trap 202 (e.g. at the melting point thereof) may be greater than the total power of the electron beam 23. It is thus possible to prevent the beam trap 202 from being damaged.

In the second configuration 200b (also referred to as working configuration 200b), the electron beam 23 may be directed past the beam trap 202, e.g. through a propagation region 201. The propagation region 201 may illustratively denote the region through which the electron beam 23 propagates if the latter is configured for evaporating the coating material. The propagation region 201 may extend for example from the electron beam gun 112 past the beam trap 202.

By way of example, in the working configuration 200b, the beam trap 202 may be irradiated by means of the electron beam 23 to a lesser extent (e.g. with a lower power density) than in the blanking configuration 200a. Alternatively or additionally, in the working configuration, the electron beam 23 may be deflected in accordance with a second deflection pattern (also referred to as working deflection pattern) and/or second deflection sequence (also referred to as working sequence), which differs from the blanking configuration 200a, for example.

The electron beam may be deflected periodically in accordance with one or more than one deflection pattern. The one or more than one deflection pattern of a period may also be referred to as deflection sequence. By way of example, successive deflection patterns may emerge from one another by means of a similarity transformation. The first deflection sequence and the second deflection sequence may differ from one another, e.g. in terms of at least one deflection pattern. The deflection sequence for deflecting the electron beam may be repeated continuously, for example, until a changeover is made to a different deflection sequence.

If the power density, total power or some other radiometric variable of an electron beam gun 112 or of the electron beam 23 is specified, this may be averaged over time, e.g. over the period duration. By way of example, the power density, total power or some other radiometric variable may be related to a deflection sequence. By way of example, the second deflection sequence may provide a higher (e.g. angle-related) power density than the first deflection sequence. Alternatively or additionally, the total power of the electron beam for the second deflection sequence and the first deflection sequence may be substantially identical. The angle-related power density (also referred to as radiation intensity) may be understood as the radiant flux per solid angle.

By way of example, the coating arrangement 200 may include the propagation region 201, into which the generated electron beam 23 propagates. The beam trap 202 may be arranged next to the propagation region 201 at least in the working configuration 200b. Alternatively or additionally, the electron beam 23 may propagate past the beam trap 202 at least in the working configuration 200b.

The one or more than one beam trap 202 may include or be formed from an electron reflector, for example. An electron reflector may be configured to emit (e.g. to reflect and/or re-emit) more electrons and/or power of the electron beam 23 than it absorbs. In other words, the electron reflector may be configured to re-emit a greater proportion of the electrons and/or power of the electron beam 23 impinging thereon than it absorbs. The absorbing may be carried out by the energy of the electrons being converted into thermal energy.

Alternatively or additionally, the one or more than one beam trap 202 may include or be formed from an electron diffusor. The electron diffusor may be configured to emit the emitted electrons diffusely (e.g. without a preferred direction), to fan out the electron beam 23 and/or to cancel the beam characteristic of the electrons 23 in some other way.

Alternatively or additionally, the one or more than one beam trap 202 may include or be formed from a thermal radiation source. The thermal radiation source may be configured to emit (e.g. to reflect and/or re-emit) fewer electrons and/or less power of the electron beam 23 than it absorbs. The absorbed electrons and/or power may be converted into thermal energy and/or thermal radiation, for example, which the beam trap 202 may re-emit.

Optionally, in an additional second configuration 200c (also referred to as conditioning configuration or third configuration), in which the electron beam is directed past the beam trap 202, a periphery (e.g. parts of the vacuum chamber or of other installed chamber equipment) of the coating arrangement 200 may be irradiated in order to heat the latter. By way of example, in the conditioning configuration 200c, the periphery may be irradiated by means of the electron beam 23, e.g. in accordance with a third deflection pattern (also referred to as conditioning deflection pattern) and/or a first deflection sequence (also referred to as conditioning sequence). Optionally, the conditioning configuration and the blanking configuration may be identical and/or correspond at least in terms of their deflection sequence.

Optionally, upon the switchover from the working configuration to the blanking configuration, the electron beam 23 may be fanned out, e.g. by it being deflected in accordance with a scanning deflection pattern. This may reduce the angle-related power density.

The working configuration 200b and the blanking configuration 200a may differ in at least one of the following: the amount of evaporated coating material, the amount of coating material applied on a workpiece, a deflection pattern, a provided (e.g. angle-related) power density, an amount of thermal radiation emitted into the coating space 224r, a transport speed and/or position of the workpiece to be coated, a position of the beam trap 202, an amount of phase transition heat provided, a length of the electron beam 23.

FIGS. 3A to 3C illustrate a coating arrangement 300 and/or a method in a plurality of configurations 200a, 200b in accordance with various embodiments in a schematic side view or cross-sectional view, e.g. the coating arrangement 100 or 200.

The coating arrangement 300 may optionally include a plurality of (e.g. exactly two or more than two) electron beam guns 112, each electron beam gun of which is configured for providing an electron beam. The coating arrangement 300 may optionally include one or more than one crucible. A crucible 304 may include for example a cavity for receiving a coating material 302 to be evaporated.

By way of example, the coating arrangement 300 may include, for each electron beam gun of the plurality of electron beam guns 112, at least one crucible 304 assigned to the electron beam gun. By way of example, the electron beam gun 112 and the at least one crucible 304 assigned thereto may form a crucible-gun group 112a, 112b, wherein for example the coating arrangement 300 may include one or more than one crucible-gun group 112a, 112b.

The or each crucible-gun group 112a, 112b may be configured to provide at least one vapor source. A vapor source may be understood as a source of a gaseous coating material 302.

At least one (e.g. exactly one, more than one or each) crucible-gun group 112a, 112b of the coating arrangement 300 may include at least one beam trap 202.

If a plurality of crucible-gun groups 112a, 112b are switched over between the blanking configuration 200a and the working configuration 200b, then they may be driven (e.g. by means of the control device 204) in such a way that a maximum of one crucible-gun group 112a, 112b is driven in accordance with the blanking configuration 200a.

The cavity of the crucible 304 of the or each crucible-gun group 112a, 112b may be open in the direction of the electron beam gun 112 of the crucible-gun group 112a, 112b and/or the beam trap 202 of the crucible-gun group 112a, 112b. Alternatively or additionally, the beam trap 202 of the crucible-gun group 112a, 112b, at least in the blanking configuration 200a, may be arranged between the crucible 304 of the crucible-gun group 112a, 112b and the electron beam gun 112 of the crucible-gun group 112a, 112b.

The coating space 224r may be arranged between two propagation regions 201, for example, in which the respectively generated electron beam 23 propagates. Alternatively or additionally, the coating space 224r may be arranged between the beam trap 202 and the crucible(s) 114 or coating material.

The respective propagation region 201, at least in the working configuration 200b, may provide a line of sight between the electron beam gun 112 and the at least one crucible 114 assigned thereto.

The coating arrangement 300 may include a handling device 314 (also referred to as displacement device or transport device) for displacing one or more than one workpiece 312 to be coated.

By way of example, the handling device 314 may include a carrier 314, by means of which the one or more than one workpiece 312 may be carried during displacement. The handling device 314 may be understood as a device that may be used to provide a flow of workpieces to or from the coating space 224r. To that end, the handling device 314 may include a plurality of transport rollers, for example, which transport the carrier 314, for example.

The or each workpiece 312 to be coated may include or be formed from a turbine blade, for example. Alternatively or additionally, the coating material may include or be formed from a ceramic or a metal.

The method may include, in 300a, driving at least one (i.e. exactly one, more than one or each) electron beam gun of the plurality of electron beam guns 112, e.g. the electron beam gun of a first crucible-gun group 112a and/or of a second crucible-gun group 112b, in accordance with the working configuration 200b or conditioning configuration 200c. In the working configuration 300b, the at least one electron beam gun 112 may irradiate a coating material 302 by means of the electron beam 23. The irradiated coating material 302 may be thermally emitted, i.e. thermally converted into its gas phase, e.g. into the coating space 224r.

The method may include, in 300b, displacing (e.g. transporting) one or more than one workpiece 312 in a direction 301 toward the coating material 302, e.g. into the coating space 224r. The one or more than one workpiece 312 may be held and/or transported by means of the carrier 314 (also referred to as workpiece carrier 314). The displacing may be carried out along a path 301 which is arranged in the coating space 224r and/or is extended through the latter.

The displacing may be carried out for example through one or more than one propagation region 201.

The method may include, in 300b, e.g. while the displacing is being carried out: irradiating the beam trap 202 (not illustrated) by means of an electron beam, as will be described in even greater detail later. By way of example, the electron beam gun of the first crucible-gun group 112a and/or of the second crucible-gun group 112b may irradiate the respective beam trap 202. By way of example, during the process of displacing the one or more than one workpiece 312 into the coating space 224r, the electron beam gun 112 of only the first crucible-gun group 112a may irradiate the beam trap. Alternatively or additionally, during the process of displacing the one or more than one workpiece 312 out of the coating space 224r, the electron beam gun of either the first crucible-gun group 112a and/or of the second crucible-gun group 112b may irradiate the respective beam trap 202.

The method may include, in 300c, e.g. after displacing the workpiece 312 and/or if the latter is arranged in the coating space 224r: thermally emitting the coating material 302 toward the one or more than one workpiece 312. The coating material 302 may be attached to the one or more than one workpiece 312 and form a coating of the workpiece 312.

The electron beam gun 112 and/or the beam trap 202 of the first crucible-gun group 112a and/or of the second crucible-gun group 112b may be driven in accordance with the working configuration 200b in 300a and/or 300c (e.g. by means of the control device 204). Alternatively or additionally, the electron beam gun 112 and/or the beam trap 202 of the first crucible-gun group 112a and/or of the second crucible-gun group 112b may be driven in accordance with the blanking configuration 200a in 300b (e.g. by means of the control device 204).

Optionally, switching over between the working configuration 200b and the blanking configuration 200a may be initiated automatically (e.g. by means of the control device 204), e.g. if a predefined criterion is satisfied, e.g. if a state variable to be detected of the coating arrangement 300 satisfies the criterion. The criterion may include, for example, one or more than one workpiece being transported into the coating space 224r and/or out of the latter. The variable to be detected may be detected by means of a sensor 322, for example. The sensor 322 may detect for example a transport state, a transport speed and/or a position state of the transport device (e.g. a position of the workpiece and/or of the carrier). However, other sensors, measuring elements, suchlike and/or state variables are also possible.

Optionally, the transporting of one or more than one workpiece into the coating space 224r may be blocked (e.g. by means of the control device 204), for example as long as driving in a different configuration than in the blanking configuration 200a is carried out. Alternatively or additionally, the transporting of one or more than one workpiece into the coating space 224r may be carried out (e.g. continued and/or started) (e.g. by means of the control device 204) only if the driving in the blanking configuration 200a is carried out.

Optionally, it is possible to detect a physical variable encompassing a temperature, e.g. of the one or more than one workpiece and/or in the coating space 224r. A total power of the electron beam 23 may then be controlled by open-loop and/or closed-loop control on the basis of the physical variable (e.g. the temperature) (e.g. by means of the control device 204). As an alternative or in addition to the temperature, the physical variable may reflect some other operating state of the coating arrangement 300.

The coating arrangement 300 may be configured for example for the vapor deposition (e.g. coating) of one or more than one workpiece (e.g. components) by means of EB-PVD. The coating arrangement 300 may include, for example: a vacuum chamber 224 (e.g. vapor deposition chamber), one or more than one crucible 304, a handling device 314 for transporting the one or more than one workpiece 312 to be coated, which blocks the beam path 201 from the electron beam gun 112 to the crucible 304 during the displacing (also referred to as handling process).

Figure 4A:
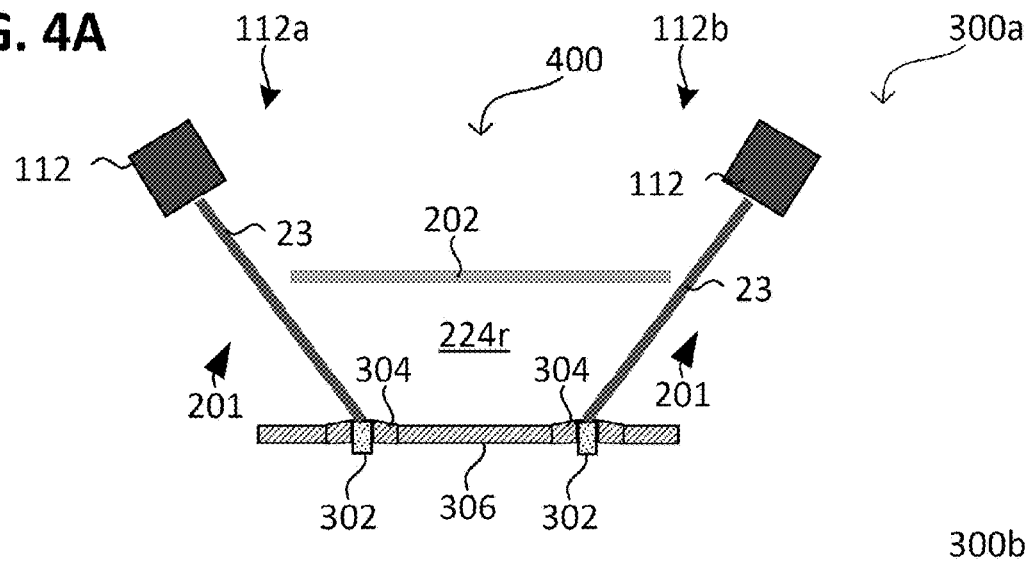
FIGS. 4A to 4C each show a coating arrangement and/or a method in a plurality of configurations in accordance with various embodiments in a schematic side view or cross-sectional view.
Figure 4B:
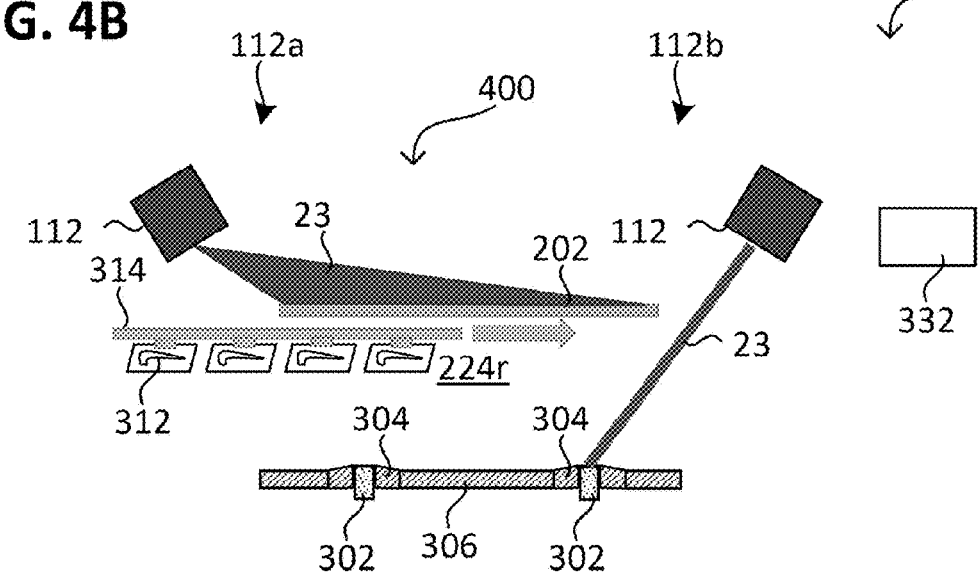
Figure 4C:
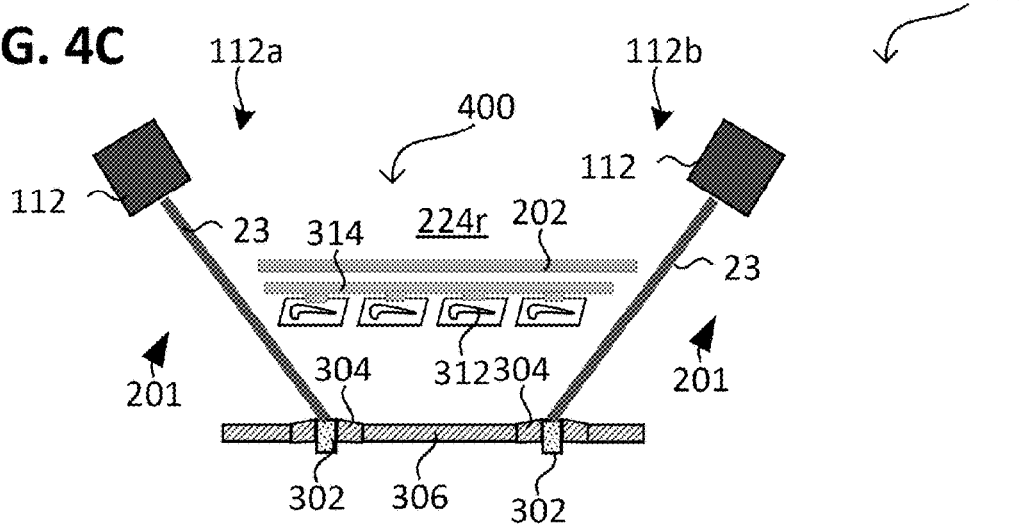

FIGS. 4A to 4C illustrate the coating arrangement 400 in a plurality of configurations 200a, 200b in a method in accordance with various embodiments in a schematic side view or cross-sectional view, e.g. the coating arrangement 100, 200 or 300.

The coating arrangement 400 may include one or the beam trap 202, which is high-temperature-resistant, i.e. is illustratively configured (constituted) in such a way that it may take up the introduced power of the electron beam 23 at least during, e.g. for the duration of, the handling process (e.g. without being damaged and/or evaporated).

High-temperature-resistant may be understood to mean that a temperature (also referred to as resistance temperature) starting from which the beam trap 202 or e.g. the irradiated section thereof is converted from the solid state of matter into a different state of matter (e.g. liquid or gaseous) is greater than approximately 1000° C. In other words, the beam trap 202 e.g. the irradiated section thereof may remain in its solid state of matter at least up to the resistance temperature. The resistance temperature may be for example the melting temperature (also referred to as melting point).

The resistance temperature may for example also be greater than approximately 1200° C., e.g. than approximately 1500° C., than approximately 2000° C., than approximately 2500° C. Alternatively or additionally, the resistance temperature may be greater than a temperature at which the coating material undergoes transition to the gaseous or liquid state. What may thus be achieved is that the beam trap withstands the coating conditions.

By way of example, the beam trap 202 may include or be formed from a high-temperature-resistant material. If the coating on the workpiece is intended to be as free of contaminants as possible, the beam trap 202 may alternatively or additionally include the coating material.

By way of example, the beam trap 202 may include a coating composed of the high-temperature-resistant material or the coating material. By way of example, the coating composed of the high-temperature-resistant material or composed of the coating material of the beam trap 202 may be arranged on that surface of the beam trap 202 which is irradiated in the blanking configuration 200a and/or faces the electron beam gun 112.

The high-temperature-resistant material may include or be formed from, for example, a ceramic, a nickel- or cobalt-based metal alloy and/or carbon in a carbon modification (e.g. graphite). A nickel- or cobalt-based metal alloy may be understood to mean that it includes more than 50 at % nickel or cobalt and furthermore one or more than one other metal.

As an alternative or in addition to the high-temperature-resistant material, the beam trap 202 may be configured to take up the total power of the electron beam 23 over a duration required by the process of displacing the one or more than one workpiece 312 into the coating space 224r, without exceeding its resistance temperature. By way of example, the beam trap 202 may be actively cooled, e.g. by means of a cooling device 332. The cooling device may for example cool the beam trap 202 (i.e. extract thermal energy from the latter) by means of a cooling fluid (e.g. water or nitrogen). The cooling fluid may flow for example through a cavity in the interior of the beam trap 202. The cavity may for example provide a heat exchanger or be at least part thereof. By way of example, the beam trap 202 may be at least partly water-cooled.

Optionally, the beam trap 202 may have a surface which is irradiated in the blanking configuration 200a and/or faces the electron beam gun 112, wherein the surface is coupled to the heat exchanger thermally (e.g. in a heat-conducting manner).

As an alternative or in addition to the cooling device 332, the beam trap 202, at a temperature lower than the resistance temperature, may have a thermal power loss that is greater than the total power of the electron beam 23.

The beam trap 202 may be mounted in a stationary manner, for example. By way of example, upon switchover between the working configuration 200b and the blanking configuration 200a, it is possible for the beam trap 202 not to be moved, i.e. to remain in the same spatial position. In other words, in the working configuration 200b, the beam trap 202 may have substantially the same spatial position (i.e. orientation and/or location) as in the blanking configuration 200a. In alternative configurations, however, the beam trap 202 may also be mounted in a movable manner, as will be described in greater detail below.

The beam trap 202 may optionally be configured as an electron diffusor.

Optionally, the beam trap 202 may be arranged nearer to the electron beam gun 112 than to the path (e.g. transport plane) along which the one or more than one workpiece 312 to be coated is displaced.

In 300b, the first electron beam gun 112 may be driven in accordance with the blanking configuration 200a. In the blanking configuration 200a, the solid angle swept over by means of the electron beam 23 may be greater, for example, than in the working configuration 200b. In other words, the blanking deflection pattern may be configured for irradiating a larger solid angle than the working deflection pattern.

Figure 5A:
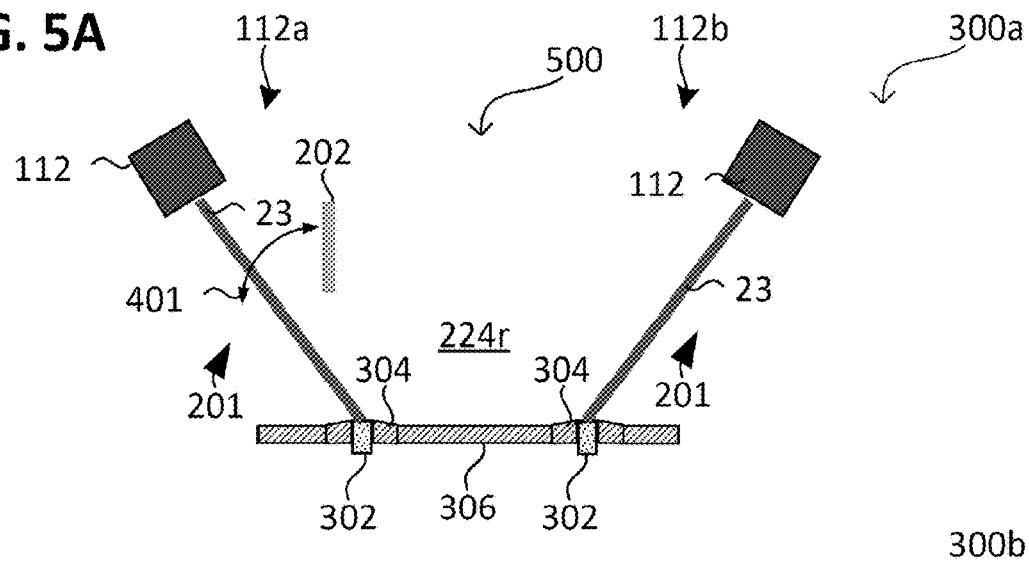
FIGS. 5A to 5C each show a coating arrangement and/or a method in a plurality of configurations in accordance with various embodiments in a schematic side view or cross-sectional view.
Figure 5B:
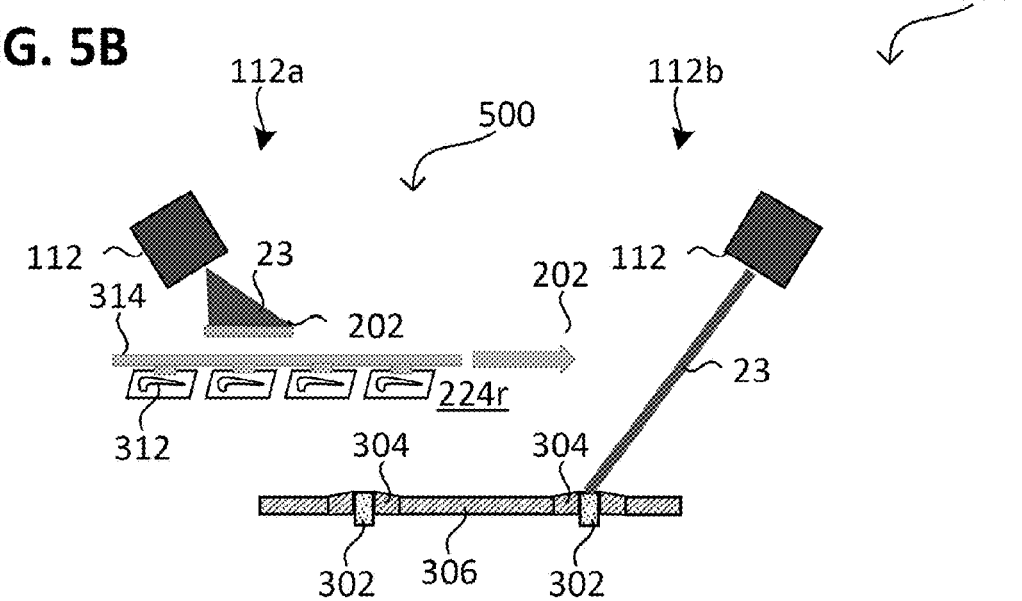
Figure 5C:
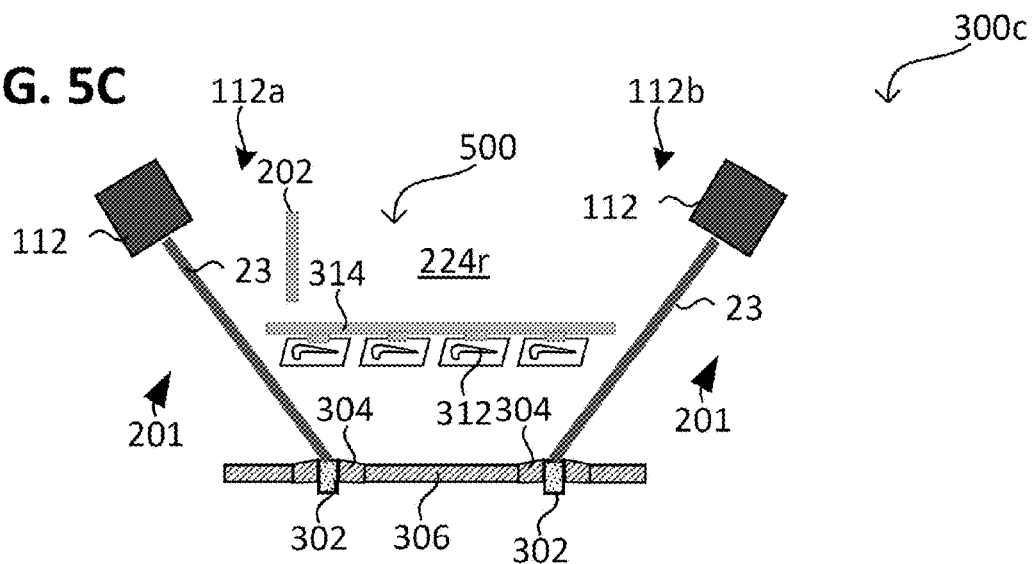

FIGS. 5A to 5C illustrate the coating arrangement 500 in a plurality of configurations 200a, 200b in a method in accordance with various embodiments in a schematic side view or cross-sectional view, e.g. the coating arrangement 100, 200, 300 or 400.

The coating arrangement 500 may include one or the beam trap 202 (e.g. diffusor), which is mounted movably 401 (then also referred to as a shutter 202). By way of example, the beam trap 202 may be mounted pivotably (that is to say that the orientation of said beam trap is also variable), e.g. about a pivoting axis. Illustratively, the beam trap 202 may be pivotable into the beam path 201 and/or out of the latter.

By way of example, in the blanking configuration 200a, the beam trap 202 may be arranged in the propagation region 201 and/or be displaced into the latter. Alternatively or additionally, in the working configuration 200b, the beam trap 202 may be arranged outside, e.g. next to, the propagation region 201 and/or be displaced out of the latter.

Optionally, the beam trap 202 may include a coating composed of the high-temperature-resistant material on that side of the beam trap 202 which is irradiated in the blanking configuration 200a and/or faces the electron beam gun 112.

Alternatively or additionally, the coating may include atoms having a higher atomic number than the coating material.

Illustratively, in the blanking configuration 200a, the beam trap 202 may be arranged for example in such a way that, during the handling process and/or after the handling process, it is in thermal radiation interaction with the one or more than one workpiece 312 to be coated.

Figure 6A:
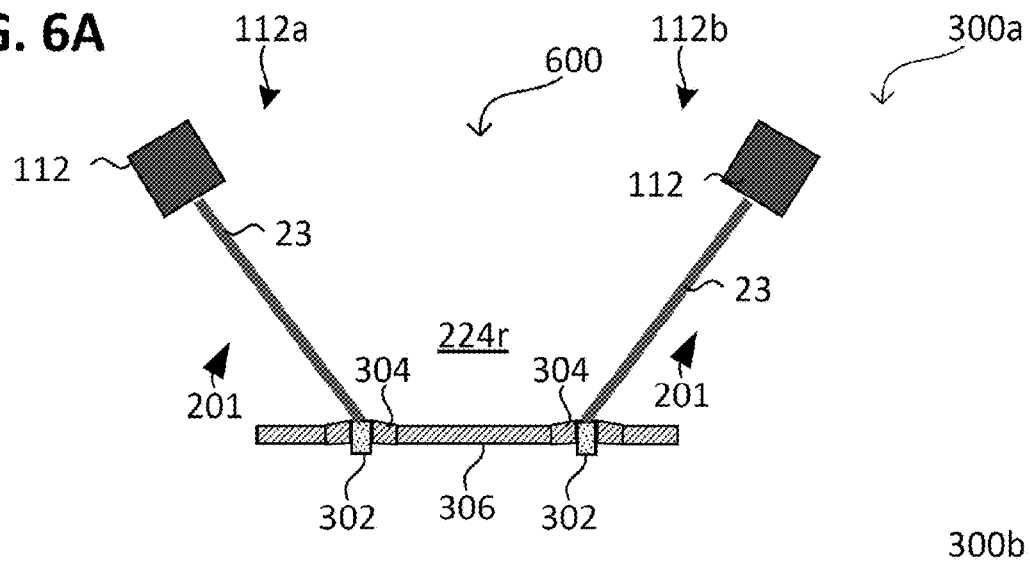
FIGS. 6A to 6C each show a coating arrangement and/or a method in a plurality of configurations in accordance with various embodiments in a schematic side view or cross-sectional view.
Figure 6B:
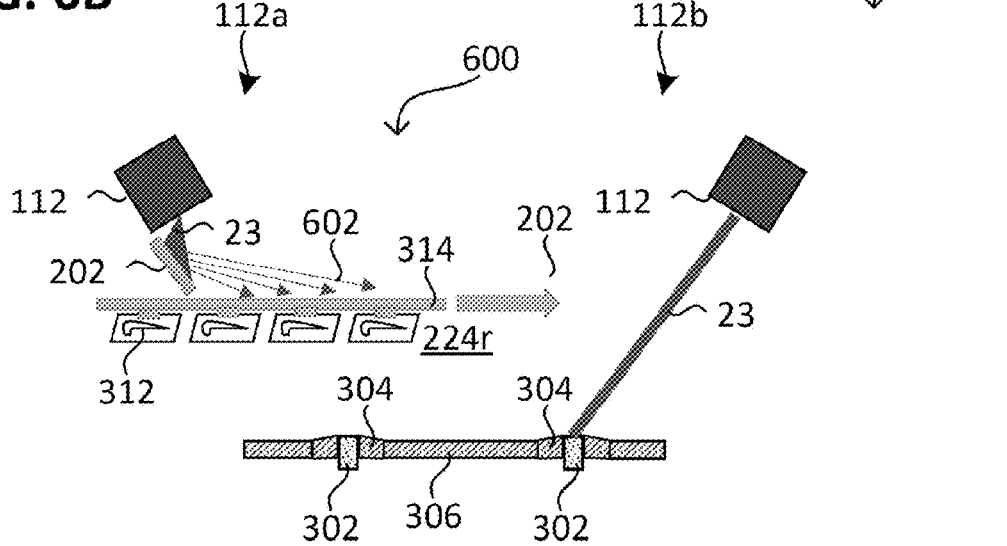
Figure 6C:
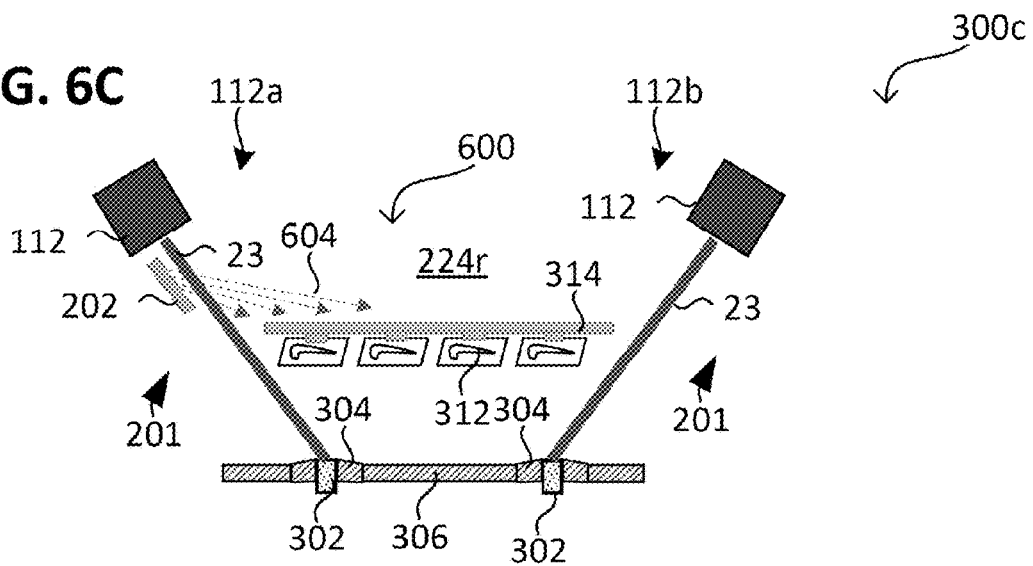

FIGS. 6A to 6C illustrate the coating arrangement 600 in a plurality of configurations 200a, 200b in a method in accordance with various embodiments in a schematic side view or cross-sectional view, e.g. the coating arrangement 100, 200, 300, 400 or 500.

The coating arrangement 600 may include one or the beam trap 202. The beam trap 202 of the coating arrangement 600 may be arranged in such a way that, in the blanking configuration 200a, it may emit at least one portion of the emitted (e.g. reflected and/or re-emitted) electrons 602 in the direction of the coating space 224r, e.g. in the direction of the one or more than one workpiece 312. By way of example, in the blanking configuration 200a, the one or more than one workpiece 312 may be irradiated with electrons which originate (e.g. are reflected) from the beam trap 202. Alternatively or additionally, in the blanking configuration 200a, by means of the beam trap 202, electrons may be reflected in the direction of the coating space 224r, e.g. in the direction of the one or more than one workpiece 312.

This may be achieved, for example, by virtue of the angle of incidence (i.e. the angle between the electron beam 23 and the irradiated surface) being less than approximately 45° (also referred to as grazing incidence), e.g. less than approximately 30°, e.g. less than approximately 20°, e.g. less than approximately 10°.

In the working configuration 200b, the beam trap 202 may be arranged (e.g. by means of the control device 204) in such a way that thermal radiation 604 emitted by said beam trap (e.g. by the irradiated surface) is emitted in the direction of the coating space 224r, e.g. in the direction of the one or more than one workpiece 312. By way of example, in the working configuration 200b, the one or more than one workpiece 312 may be heated (i.e. thermal energy may be fed thereto) by means of thermal radiation which originates from the beam trap 202.

Optionally, the beam trap 202 of the coating arrangement 600 may be arranged in a stationary (i.e. immobile) manner. Alternatively or additionally, the coating and/or surface of the beam trap 202 which is irradiated may include atoms having a higher atomic number than the coating material.

FIGS. 7A to 7C illustrate the coating arrangement 700 in a plurality of configurations 200a, 200b in a method in accordance with various embodiments in a schematic side view or cross-sectional view, e.g. the coating arrangement 100, 200, 300, 400, 500 or 600.

The coating arrangement 700 may include one or the beam trap 202, which, together with the carrier 314, is configured to be displaceable into the coating space 224r and/or out of the latter. By way of example, the beam trap 202 may be secured to the carrier 314 and/or be part thereof. The carrier 314 may include a framework, on which the one or more than one workpiece 312 is held, e.g. in a suspended manner. The framework may include or be formed from a frame, for example. The beam trap 202 may cover the framework or the one or more than one workpiece 312 carried thereby.

FIG. 8 illustrates a method 800 in accordance with various embodiments in a schematic flow diagram, e.g. for operating the coating arrangement 100, 200, 300, 400, 500, 600 or 700.

The method 800 may include, in 801: displacing one or more than one workpiece in a direction toward a coating material, e.g. in the blanking configuration 200a. The workpiece may be displaced into a coating space, for example, which is arranged for example above the coating material and/or between the coating material and the beam trap.

The method 800 may include, in 803: during the displacing, irradiating a beam trap by means of an electron beam. By way of example, the method 800 may include, in 805: driving the beam trap and/or the electron beam gun in accordance with the blanking configuration 200a. The beam trap may be arranged at a distance from the coating material and/or between the coating material and the electron beam gun.

By way of example, the coating material and the beam trap may differ from one another, e.g. in terms of at least the chemical composition and/or the resistance temperature. Alternatively or additionally, the one or more than one workpiece and the beam trap may differ from one another, e.g. in terms of at least the chemical composition and/or the resistance temperature.

The method 800 may include, in 805: after the displacing, thermally emitting the coating material toward the one or more than one workpiece by means of the electron beam, e.g. in the working configuration 200b. By way of example, the method 800 may include, in 805: driving the beam trap and/or the electron beam gun in accordance with the working configuration 200b. Thermally emitting may include heating the coating material by means of the electron beam and/or converting it into a gaseous state of matter. The coating material may be emitted into the coating space, for example.

The method 800 may optionally include, in 807: coating the one or more than one workpiece with the coating material.

A description is given below of various examples relating to what has been described above and is illustrated in the figures.

Example 1 is a coating arrangement, including: an electron beam gun for providing an electron beam; a beam trap (e.g., illustratively, a beam blocker, beam dumb or beam obstacle) for trapping (e.g., blocking) the electron beam; a control device for driving the electron beam gun and/or the beam trap, wherein the control device is configured to switch over the driving between a plurality of configurations, of which: in a first configuration, the electron beam is directed onto the beam trap; and in a second configuration, the electron beam is directed past the beam trap (e.g. passes the beam trap).

Example 2 is a coating arrangement in accordance with example 1, wherein the beam trap includes a heat exchanger and/or remains in a solid state of matter up to a temperature, wherein the temperature (also referred to as resistance temperature) is greater than 1000° C.

Example 3 is a coating arrangement in accordance with example 2, wherein the heat exchanger includes at least one fluid line and/or a fluid flows through said heat exchanger.

Example 4 is a coating arrangement in accordance with any of examples 1 to 3, wherein the beam trap includes a ceramic, a nickel- or cobalt-based metal alloy and/or carbon in a carbon modification (e.g. graphite).

Example 5 is a coating arrangement in accordance with any of examples 1 to 4, wherein the beam trap includes a coating; and wherein optionally the coating includes a ceramic, a nickel- or cobalt-based metal alloy and/or carbon in a carbon modification (e.g. graphite).

Example 6 is a coating arrangement in accordance with any of examples 1 to 5, wherein the beam trap includes or is formed from a planar element (e.g. a plate).

Example 7 is a coating arrangement in accordance with any of examples 1 to 6, wherein the beam trap provides a reflection coefficient and an absorption coefficient for electrons or the electron beam, wherein the reflection coefficient is greater than the absorption coefficient, and/or wherein the beam trap is configured to reflect and/or re-emit more electrons that it absorbs.

Example 8 is a coating arrangement in accordance with any of examples 1 to 7, wherein the beam trap is configured to convert at least part of the power introduced by means of the electron beam into thermal radiation, and to emit the thermal radiation for example in a direction away from the electron beam gun and/or toward a coating material and/or toward a workpiece.

Example 9 is a coating arrangement in accordance with any of examples 1 to 8, wherein an averaged spatial power density (e.g. angle-related) provided by the electron beam is greater in the second configuration than in the first configuration.

Example 10 is a coating arrangement in accordance with any of examples 1 to 9, wherein the electron beam scans the beam trap in the first configuration (e.g. in accordance with a deflection pattern).

Example 11 is a coating arrangement in accordance with any of examples 1 to 10, wherein, in the first configuration, the electron beam irradiates an (e.g. planar) surface of the beam trap, wherein an angle of incidence of the electron beam relative to the surface is less than 45°, e.g. less than approximately 30°, e.g. less than approximately 20°, e.g. less than approximately 10°.

Example 12 is a coating arrangement in accordance with any of examples 1 to 11, wherein, in the first configuration, the electron beam irradiates the beam trap with a power density in such a way that a temperature of the beam trap that is brought about by the power density is less than a temperature (e.g. the resistance temperature) at which the beam trap or parts thereof change their state of matter (e.g. become liquid or gaseous); and/or wherein, in the first configuration, substantially none or at least less material than in the second configuration is converted into the gaseous state of matter.

Example 13 is a coating arrangement in accordance with any of examples 1 to 12, wherein the beam trap is mounted displaceably (e.g. between two positions) relative to the electron beam gun, and wherein the control device 204 is configured to displace the beam trap (e.g. between the two positions) upon the switchover between the first configuration and the second configuration, e.g. by means of an actuator.

Example 14 is a coating arrangement in accordance with any of examples 1 to 13, wherein the displacing includes displacing (e.g. pivoting and/or shifting) the beam trap toward the electron beam gun upon switchover into the first configuration, e.g. by means of the actuator.

Example 15 is a coating arrangement in accordance with any of examples 1 to 14, wherein the control device 204 is configured to provide the electron beam gun with a plurality of deflection patterns in accordance with which the electron beam is deflected; and wherein the control device is configured to switch over (i.e. to change) the beam trap between the plurality of deflection patterns upon switchover between the first configuration and the second configuration.

Example 16 is a coating arrangement in accordance with any of examples 1 to 15, furthermore including: a crucible (e.g. assigned to the electron beam gun) (said crucible e.g. having a cavity) for receiving a coating material to be evaporated, wherein, in the second configuration, the electron beam is directed onto the crucible (e.g. the cavity); wherein for example the beam trap is arranged between the electron beam gun and the crucible, and/or wherein for example the cavity of the crucible is open in the direction of the beam trap.

Example 17 is a coating arrangement in accordance with example 16: the coating material arranged in the crucible, wherein at least one surface of the beam trap includes the coating material or has at least one chemical composition substantially identical to that of the coating material and/or has at least the same material type as the coating material.

Example 18 is a coating arrangement in accordance with any of examples 1 to 17, furthermore including: a transport device configured to transport one or more than one workpiece to be coated along a transport path and/or past the beam trap; wherein for example the transport path is arranged between the crucible and the electron beam gun and/or between the crucible and the beam trap; and/or wherein for example the beam trap is arranged between the transport path and the electron beam gun.

Example 19 is a coating arrangement in accordance with example 18, wherein the control device is furthermore configured, in the first configuration, to provide (e.g. to start and/or to continue) the transporting by means of the transport device; and the second configuration, to interrupt and/or to block the transporting by means of the transport device; and/or wherein the control device is furthermore configured, in the first and/or second configuration, to control by open-loop and/or closed-loop control a temperature of the workpiece to be coated by means of driving (e.g. changing an operating point of) the electron beam gun.

Example 20 is a coating arrangement in accordance with example 19, furthermore including: a first measuring element (e.g. a first sensor) and/or a second measuring element (e.g. a second sensor), wherein the first measuring element is configured to detect a temperature of the workpiece to be coated, wherein the second measuring element is configured to detect a transport state (e.g. transport speed and/or a transport position) of the one or more than one workpiece to be coated, wherein driving the electron beam gun is carried out on the basis of the detected temperature; and/or wherein driving the transport device is carried out on the basis of the detected transport state.

Example 21 is a coating arrangement in accordance with any of examples 1 to 20, furthermore including: a carrier including one or more than one workpiece receptacle region (e.g. including a holding device) for receiving at least one workpiece to be coated, wherein the beam trap is optionally secured to the carrier.

Example 22 is a coating arrangement in accordance with example 21, wherein the carrier includes a framework that carries the beam trap; and/or wherein the or each workpiece receptacle region of the carrier includes a holding device for holding a workpiece in the workpiece receptacle region in a suspended position.

Example 23 is a coating arrangement in accordance with any of examples 1 to 22, furthermore including: a vacuum chamber (e.g. a coating chamber), in which the beam trap and/or the crucible are/is arranged.

Example 24 is a coating arrangement in accordance with any of examples 1 to 23, wherein, of the plurality of configurations, in a third configuration, the electron beam is directed onto a surface arranged next to the workpiece, next to the beam trap and next to the coating material (e.g. a part of the vacuum chamber), wherein for example less material is converted into the gaseous state of matter in the third configuration than in the second and/or first configuration.

Example 25 is a coating arrangement in accordance with example 24, wherein the control device is furthermore configured, in the third configuration, to block the transporting by means of the transport device.

Example 26 is a coating arrangement in accordance with example 24 or 25, furthermore including: a sensor configured to detect a temperature of the surface or near the latter, wherein the control device 204 is furthermore configured, in the third configuration, to control by open-loop and/or closed-loop control the temperature of the surface by means of driving (e.g. changing an operating point of) the electron beam gun 112.

Example 27 is a coating arrangement in accordance with any of examples 1 to 26, furthermore including: an additional electron beam gun, and an energy supply (e.g. including or formed from a multiple high-voltage supply) for supplying both the electron beam gun and the additional electron beam gun 112 with electrical energy, wherein the energy supply includes exactly one transformer (e.g. high-voltage transformer), which provides the electrical energy (e.g. for accelerating the beam electrons), wherein the transformer is configured for example to provide an electrical high voltage (e.g. an electrical high voltage of more than approximately 5 kV, e.g. of more than approximately 10 kV, e.g. of more than approximately 20 kV, e.g. of more than approximately 30 kV, e.g. of more than approximately 40 kV, e.g. of more than approximately 50 kV, e.g. in a range of approximately 25 kV to approximately 60 kV).

Example 28a is a method for coating a workpiece, for example by means of a coating arrangement in accordance with any of examples 1 to 27, the method including: displacing a workpiece in a direction toward a coating material; during the displacing, irradiating a beam trap (e.g., illustratively, a beam blocker or beam obstacle) by means of an electron beam; after the displacing, thermally emitting the coating material toward the workpiece by means of the electron beam.

Example 28b is a method for coating a workpiece, for example by means of a coating arrangement in accordance with any of examples 1 to 27, the method including: driving an electron beam and/or a beam trap (e.g., illustratively, a beam blocker or beam obstacle) in accordance with a plurality of configurations, of which: in a first configuration, the electron beam is directed onto the beam trap; and, in a second configuration, the electron beam is directed past the beam trap onto a coating material (for the purpose of thermally emitting the coating material); displacing the workpiece in a direction toward the coating material if the driving is carried out in accordance with the first configuration.

Example 29 is a method in accordance with example 28a or 28b, wherein the process of thermally emitting includes converting the coating material into a gaseous state of matter.

Example 30 is a method in accordance with example 28a, 28b or 29, wherein the process of thermally emitting includes irradiating the coating material with the electron beam passing the beam trap.

Example 31 is a method in accordance with any of examples 28a to 30, wherein the displacing includes displacing the workpiece past the beam trap.

Example 32 is a method in accordance with any of examples 28a to 31, furthermore including: displacing the beam trap between two positions, of which, in a first position, irradiating of the beam trap is carried out and, in a second position, the beam trap is arranged next to the electron beam; and/or wherein the beam trap in the first configuration is in a first position, in which irradiating of the beam trap is carried out, and in the second configuration is in a second position, in which the beam trap is arranged next to the electron beam, wherein for example the first and second positions are different from one another.

Example 33 is a method in accordance with any of examples 28a to 32, wherein displacing the beam trap into a or the first position includes displacing the beam trap into the electron beam.

Example 34 is a method in accordance with any of examples 28a to 33, furthermore including: deflecting the electron beam by means of a plurality of deflection patterns (also referred to as electron beam patterns), of which a first deflection pattern in accordance with which the electron beam is deflected causes the beam trap to be irradiated, and a second deflection pattern in accordance with which the electron beam is deflected brings about the process of thermally emitting; wherein the first and second deflection patterns are different from one another, e.g. in terms of at least the averaged spatial power density (e.g. angle-related) which they provide.

Example 35 is a method in accordance with any of examples 28a to 34, wherein irradiating the beam trap includes reflecting and/or re-emitting more electrons from the beam trap than absorbing electrons.

Example 36 is a method in accordance with any of examples 28a to 35, wherein irradiating the beam trap includes irradiating a surface of the beam trap, wherein the surface of the beam trap includes the coating material or has at least one chemical composition substantially identical to that of the coating material and/or has at least the same material type as the coating material.

Example 37 is a method in accordance with any of examples 28a to 36, wherein irradiating the beam trap includes converting at least part of the power introduced by means of the electron beam into thermal radiation and heating the workpiece by means of the thermal radiation (i.e. feeding thermal energy to said workpiece).

Example 38 is a method in accordance with any of examples 28a to 37, wherein irradiating the beam trap includes bringing the beam trap to a temperature of more than 500° C. and/or of more than 80% of its resistance temperature.

Example 39 is a method in accordance with any of examples 28a to 38, wherein irradiating the beam trap includes scanning the beam trap (e.g. in accordance with a deflection pattern).

Example 40 is a method in accordance with any of examples 28a to 39, wherein irradiating the beam trap includes irradiating an (e.g. planar) surface of the beam trap, wherein an angle of incidence of the electron beam relative to the surface is greater than 45°.

Example 41 is a method in accordance with any of examples 28a to 40, wherein irradiating the beam trap includes irradiating the beam trap with a power density such that a temperature of the beam trap that is brought about by the power density is less than a temperature at which the beam trap or parts thereof change their state of matter.

Example 42 is a method in accordance with any of examples 28a to 41, furthermore including: during the process of irradiating the beam trap, cooling (i.e. extracting thermal energy from) the beam trap by means of a cooling device (e.g. a cooling fluid).

Example 43 is a method in accordance with any of examples 28a to 42, wherein the workpiece is carried by a carrier during the displacing, wherein the beam trap is secured to the carrier.

Example 44 is a method in accordance with any of examples 28a to 43, furthermore including: coating the workpiece by means of the emitted coating material.

Example 45 is a method in accordance with any of examples 28a to 44, furthermore including: before coating the workpiece, heating the workpiece to a temperature of greater than 500° C. (e.g. 1000° C.), wherein during coating the workpiece is at the temperature or a temperature deviating therefrom by less than 25° C. (e.g. 10° C.)

Example 46 is a method in accordance with any of examples 28a to 45, wherein the process of irradiating the beam trap and/or the process of thermally emitting are/is carried out in a vacuum.

Example 47 is the use of an electron beam for indirectly heating a workpiece to be coated, by a beam trap (e.g., illustratively, a beam blocker or beam obstacle) being irradiated by means of the electron beam, e.g. by means of a coating arrangement and respectively the method in accordance with any of examples 1 to 46.

Example 48 is the use in accordance with example 47, wherein the beam trap passes on at least part of the power of the electron beam to the workpiece in the form of radiation (e.g. electron radiation and/or thermal radiation).

The invention claimed is:

1. A coating arrangement, comprising:
an electron beam gun for providing an electron beam;
a beam trap for trapping the electron beam; a transport device configured to transport one or more workpieces to be coated along a transport path;
a crucible, wherein the beam trap is disposed below the electron beam gun and above the transport path, and vertically over the crucible;
a control device for driving the electron beam gun and/or the beam trap,
wherein the control device is configured to switch over the driving between a plurality of configurations, of which:
in a first configuration, the electron beam is directed onto the beam trap; and
in a second configuration, the electron beam is directed past the beam trap towards the crucible.

2. The coating arrangement as claimed in claim 1,
wherein the beam trap comprises a heat exchanger and/or remains in a solid state of matter up to a temperature, wherein the temperature is greater than 1000° C.

3. The coating arrangement as claimed in claim 1,
wherein an angle-related averaged spatial power density provided by the electron beam is greater in the second configuration than in the first configuration.

4. The coating arrangement as claimed claim 1,
wherein, in the first configuration, the electron beam irradiates a surface of the beam trap, wherein an angle of incidence of the electron beam with respect to the surface is greater than 45°.

5. The coating arrangement as claimed in claim 1,
furthermore comprising:
wherein the crucible comprises a cavity for receiving a coating material to be evaporated, wherein the cavity of the crucible is open in the direction of the beam trap.

6. The coating arrangement as claimed in claim 1,
wherein the control device is furthermore configured, in the first configuration, to provide the transporting by means of the transport device; and
the second configuration, to interrupt and/or to block the transporting by means of the transport device.

7. The coating arrangement as claimed in claim 1, furthermore comprising:
a carrier comprising one or more than one workpiece receptacle region for receiving at least one workpiece to be coated.

8. The coating arrangement as claimed in claim 1, furthermore comprising:
an additional electron beam gun, and
an energy supply for supplying both the electron beam gun and the additional electron beam gun with electrical energy,
wherein the energy supply comprises exactly one high-voltage transformer,
which provides the electrical energy.

9. The coating arrangement as claimed in claim 1,
wherein the beam trap includes a ceramic, or a nickel- or cobalt-based metal alloy.

10. The coating arrangement as claimed in claim 1,
wherein the beam trap includes a coating.

11. The coating arrangement as claimed in claim 1,
wherein the control device is furthermore configured, in at least one of the first or second configuration, to control a temperature of one or more than one workpiece to be coated to be coated by driving the electron beam gun and/or the beam trap.

12. The coating arrangement as claimed in claim 1,
wherein the electron beam scans the beam trap in the first configuration.

13. The coating arrangement as claimed in claim 1, further comprising:
a coating material disposed in the crucible, wherein at least one surface of the beam trap comprises:
the coating material, or
at least one chemical composition substantially identical to that of the coating material, or
at least the same material type as the coating material.

14. The coating arrangement as claimed in claim 1,
wherein the first configuration is configured to indirectly heat a workpiece to be coated by the beam trap being irradiated by the electron beam.

* * * * *